(12) United States Patent
Kim et al.

(10) Patent No.: US 10,903,295 B2
(45) Date of Patent: Jan. 26, 2021

(54) DISPLAY APPARATUS AND METHOD OF MANUFACTURING THE SAME

(71) Applicant: Samsung Display Co., Ltd., Yongin-si (KR)

(72) Inventors: Hun Kim, Yongin-si (KR); Sucheol Gong, Yongin-si (KR); Namjin Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 34 days.

(21) Appl. No.: 16/203,323

(22) Filed: Nov. 28, 2018

(65) Prior Publication Data

US 2019/0326378 A1 Oct. 24, 2019

(30) Foreign Application Priority Data

Apr. 20, 2018 (KR) ........................ 10-2018-0046293

(51) Int. Cl.
| | |
|---|---|
| *H01L 27/32* | (2006.01) |
| *H01L 51/56* | (2006.01) |
| *H01L 51/00* | (2006.01) |
| H01L 21/265 | (2006.01) |
| H01L 27/12 | (2006.01) |
| H01L 29/423 | (2006.01) |

(Continued)

(52) U.S. Cl.
CPC ...... *H01L 27/3262* (2013.01); *H01L 51/0097* (2013.01); *H01L 51/56* (2013.01); *H01L 21/0262* (2013.01); *H01L 21/02488* (2013.01); *H01L 21/02491* (2013.01); *H01L 21/02505* (2013.01); *H01L 21/02532* (2013.01); *H01L 21/02592* (2013.01); *H01L 21/02667* (2013.01); *H01L 21/266* (2013.01); *H01L 21/26513* (2013.01); *H01L 27/1218* (2013.01); *H01L 27/1222* (2013.01); *H01L 27/1255* (2013.01); *H01L 27/1274* (2013.01); *H01L 29/42384* (2013.01); *H01L 29/66757* (2013.01); *H01L 29/78675* (2013.01); *H01L 2227/323* (2013.01); *H01L 2251/5338* (2013.01)

(58) Field of Classification Search
CPC ......... H01L 51/0097; H01L 2251/5338; H01L 51/56

See application file for complete search history.

(56) References Cited

U.S. PATENT DOCUMENTS

| | | | |
|---|---|---|---|
| 7,053,426 B2 | 5/2006 | Yokoyama et al. |
| 7,335,917 B2 | 2/2008 | Koo et al. |

(Continued)

FOREIGN PATENT DOCUMENTS

| | | | |
|---|---|---|---|
| JP | 2005-109148 A | 4/2005 |
| KR | 10-2005-0051458 A | 6/2005 |

(Continued)

*Primary Examiner* — Jaehwan Oh
(74) *Attorney, Agent, or Firm* — Lewis Roca Rothgerber Christie LLP

(57) ABSTRACT

A display apparatus and a method of manufacturing the same are provided. According to an embodiment, a display apparatus includes: a substrate; a thin-film transistor located on the substrate; and a buffer layer, a conductive layer, and an insulating layer sequentially located from the substrate between the substrate and the thin-film transistor, and a thickness of the insulating layer is less than a thickness of the buffer layer.

13 Claims, 8 Drawing Sheets

(51) Int. Cl.
  *H01L 29/786* (2006.01)
  *H01L 29/66* (2006.01)
  *H01L 21/02* (2006.01)
  *H01L 21/266* (2006.01)

(56) References Cited

U.S. PATENT DOCUMENTS

| | | | |
|---|---|---|---|
| 9,627,636 B2* | 4/2017 | Heo | H01L 51/0097 |
| 9,793,377 B2 | 10/2017 | Lee et al. | |
| 2015/0021562 A1* | 1/2015 | Kim | H01L 27/3244 |
| | | | 257/40 |
| 2015/0102324 A1* | 4/2015 | Lee | H01L 51/0097 |
| | | | 257/40 |
| 2015/0123098 A1* | 5/2015 | Kang | H01L 51/0097 |
| | | | 257/40 |
| 2015/0311468 A1* | 10/2015 | An | H01L 51/0097 |
| | | | 257/40 |

FOREIGN PATENT DOCUMENTS

| | | |
|---|---|---|
| KR | 10-2013-0044626 A | 5/2013 |
| KR | 10-2013-0136063 A | 12/2013 |
| KR | 10-2014-0079093 A | 6/2014 |
| KR | 10-2015-0125151 A | 11/2015 |

* cited by examiner

DISPLAY APPARATUS AND METHOD OF MANUFACTURING THE SAME

CROSS-REFERENCE TO RELATED APPLICATION

This application claims priority to and the benefit of Korean Patent Application No. 10-2018-0046293, filed on Apr. 20, 2018 in the Korean Intellectual Property Office, the entire disclosure of which is incorporated herein by reference.

BACKGROUND

1. Field

Aspects of embodiments of the present disclosure relate to a display apparatus and a method of manufacturing a display apparatus.

2. Description of the Related Art

In general, a display apparatus includes a display device and electronic devices for controlling an electrical signal applied to the display device. The electronic devices include a thin-film transistor (TFT), a storage capacitor, and a plurality of wirings.

In order to accurately control whether a display device emits light and a degree of light emission, studies for improving characteristics of thin-film transistors electrically connected to a display device have been actively conducted.

SUMMARY

According to an aspect of embodiments of the present disclosure, a display apparatus includes a thin-film transistor having improved characteristics, and a method of manufacturing the display apparatus is provided.

Additional aspects will be set forth, in part, in the description which follows and, in part, will be apparent from the description, or may be learned by practice of the presented embodiments.

According to one or more embodiments, a display apparatus includes: a substrate; a thin-film transistor located on the substrate; and a buffer layer, a conductive layer, and an insulating layer sequentially located from the substrate between the substrate and the thin-film transistor, wherein a thickness of the insulating layer is less than a thickness of the buffer layer.

The thickness of the insulating layer may be from about 30 Å to about 50 Å.

The thickness of the insulating layer may be from about 1/600 to about 1/200 of the thickness of the buffer layer.

The conductive layer may include a material, and the insulating layer may include an oxide AOx of the material, where A is the material and x is a positive number.

The material may include at least one selected from the group consisting of aluminum (Al), tin oxide (SnO), calcium (Ca), and magnesium (Mg), and the oxide AOx may include at least one selected from the group consisting of $Al_2O_3$, $SnO_2$, CaO, and MgO.

The thin-film transistor may include: a semiconductor layer located on the insulating layer and including a source region, a drain region, and a channel region; a gate insulating layer covering the semiconductor layer; and a gate electrode located on the gate insulating layer to overlap the channel region of the semiconductor layer, wherein a thickness of the gate insulating layer is greater than the thickness of the insulating layer.

The display apparatus may further include an organic light-emitting device connected to the thin-film transistor and including a pixel electrode, an intermediate layer including an organic emission layer, and a counter electrode.

The substrate may include a first flexible substrate, a first barrier layer, a second flexible substrate, and a second barrier layer that are sequentially stacked.

According to one or more embodiments, a display apparatus includes: a substrate including a first flexible substrate, a first barrier layer, a second flexible substrate, and a second barrier layer that are sequentially stacked; a thin-film transistor located on the substrate; and a conductive layer and an insulating layer sequentially located from the second barrier layer between the second barrier layer and the thin-film transistor, wherein a thickness of the conductive layer is from about 30 Å to about 100 Å, and a thickness of the insulating layer is from about 30 Å to about 50 Å.

The conductive layer may include a material, and the insulating layer may include an oxide AOx of the material, where A is the material and x is a positive number.

The material may include at least one selected from the group consisting of aluminum (Al), tin oxide (SnO), calcium (Ca), and magnesium (Mg), and the oxide AOx may include at least one selected from the group consisting of $Al_2O_3$, $SnO_2$, CaO, and MgO.

The display apparatus may further include a buffer layer located between the second barrier layer and the conductive layer.

The thin-film transistor may include: a semiconductor layer located on the insulating layer and including a source region, a drain region, and a channel region; a gate insulating layer covering the semiconductor layer; and a gate electrode located on the gate insulating layer to overlap the channel region, wherein a thickness of the gate insulating layer is greater than the thickness of the insulating layer.

The thickness of the gate insulating layer may be from about 2000 Å to about 3000 Å.

According to one or more embodiments, a method of manufacturing a display apparatus includes: forming a conductive layer on a substrate; forming an insulating layer having a thickness from about 30 Å to about 50 Å on the conductive layer; forming an amorphous silicon layer on the insulating layer; and forming a crystalline silicon layer by crystallizing the amorphous silicon layer.

The method may further include: forming a pre-semiconductor layer by patterning the crystalline silicon layer; forming a gate insulating layer on the substrate to cover the pre-semiconductor layer; forming a gate electrode on the gate insulating layer to overlap at least a part of the pre-semiconductor layer; and forming a semiconductor layer including a source region, a drain region, and a channel region by implanting dopants into the pre-semiconductor layer by using the gate electrode as a doping mask.

The conductive layer and the insulating layer may be formed by sputtering, and the amorphous silicon layer may be formed by chemical vapor deposition.

The conductive layer may include a material, and the insulating layer may include an oxide AOx of the material, where A is the material and x is a positive number.

The material may include at least one selected from the group consisting of aluminum (Al), tin oxide (SnO), calcium (Ca), and magnesium (Mg), and the oxide AOx may include at least one selected from the group consisting of $Al_2O_3$, $SnO_2$, CaO, and MgO.

A thickness of the conductive layer may be from about 30 Å to about 100 Å.

BRIEF DESCRIPTION OF THE DRAWINGS

These and/or other aspects will become apparent and more readily appreciated from the following description of some embodiments, taken in conjunction with the accompanying drawings in which.

DETAILED DESCRIPTION

Figure 1:
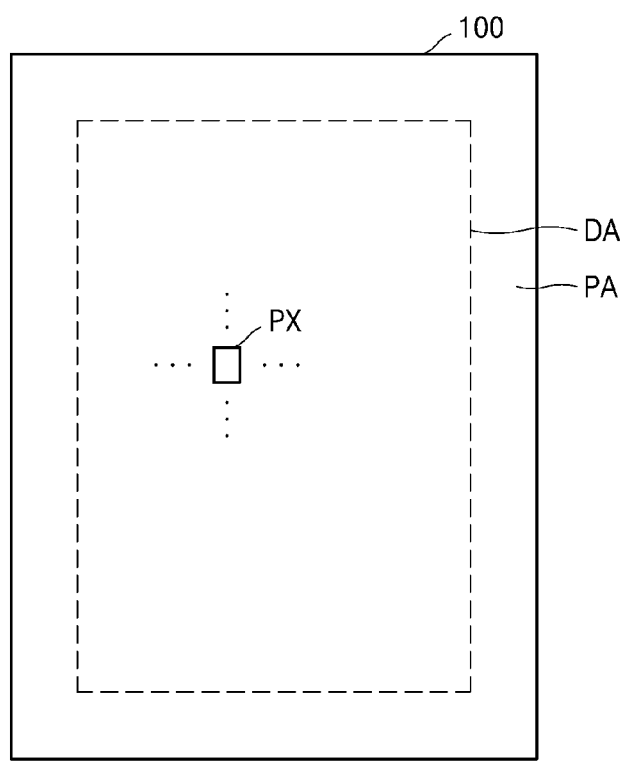
FIG. 1 is a plan view of a display apparatus according to an embodiment.

The present disclosure may include various embodiments and modifications, and embodiments thereof will be illustrated in the drawings and will be described herein in further detail. Aspects and features of the present disclosure and methods of achieving the aspects and features will be described more fully with reference to the accompanying drawings, in which some embodiments are shown. The present disclosure may, however, be embodied in many different forms and should not be construed as being limited to the embodiments set forth herein.

Reference will now be made in further detail to some embodiments, examples of which are illustrated in the accompanying drawings. In the drawings, the same elements are denoted by the same reference numerals, and a repeated explanation thereof may not be provided.

It is to be understood that although the terms "first," "second," etc. may be used herein to describe various elements, these elements should not be limited by these terms. These terms are used to distinguish one element from another.

As used herein, the singular forms "a," "an," and "the" are intended to include the plural forms as well, unless the context clearly indicates otherwise.

It is to be further understood that the terms "comprises" and/or "comprising" used herein specify the presence of stated features or components, but do not preclude the presence or addition of one or more other features or components.

It is to be understood that when a layer, region, or element is referred to as being "formed on" another layer, region, or element, it may be directly or indirectly formed on the other layer, region, or element. That is, for example, one or more intervening layers, regions, or elements may be present.

Sizes of elements may be exaggerated for convenience of explanation. In other words, since sizes and thicknesses of elements in the drawings may be arbitrarily illustrated for convenience of explanation, the following embodiments are not limited thereto.

When a certain embodiment may be implemented differently, a specific process order may be different from the described order. For example, two consecutively described processes may be performed substantially at the same time or performed in an order opposite to the described order.

It is to be understood that when a layer, region, or element is referred to as being "connected to" another layer, region, or element, it may be directly connected to the other layer, region, or element or one or more intervening layers, regions, or elements may be present. For example, it is to be understood that when a layer, region, or element is referred to as being "electrically connected to" another layer, region, or element, it may be directly electrically connected to the other layer, region, or element or one or more intervening layers, regions, or elements may be present.

As used herein, the term "and/or" includes any and all combinations of one or more of the associated listed items. Expressions such as "at least one of," when preceding a list of elements, modify the entire list of elements and do not modify the individual elements of the list.

FIG. 1 is a plan view of a display apparatus according to an embodiment.

A plurality of pixels PX including any of various display devices, such as an organic light-emitting device (OLED), may be arranged on a display area DA of a substrate 100. The pixels PX may further include a plurality of thin-film transistors (TFTs) and storage capacitors for controlling the display devices. The number of TFTs included in one pixel may vary from one to seven.

Various wirings for transmitting an electrical signal to be applied to the display area DA may be located on a peripheral area PA of the substrate 100. A TFT may also be provided on the peripheral area PA, and, in this case, the TFT located on the peripheral area PA may be a part of a circuit unit for controlling an electrical signal applied to the display area DA.

The following will be described on the assumption that a display apparatus includes an OLED as a display device for convenience. However, the present disclosure is not limited thereto, and may be applied to any of various display apparatuses, such as a liquid-crystal display apparatus, an electrophoretic display apparatus, and an inorganic electroluminescent (EL) display apparatus.

Figure 2:
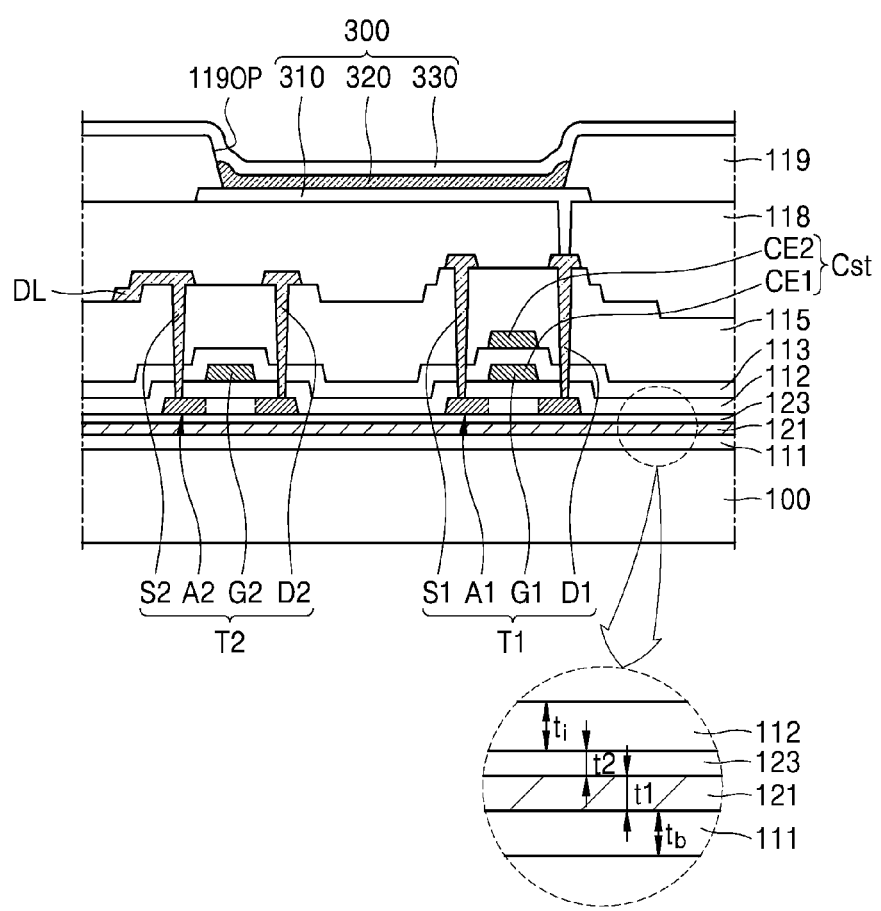
FIG. 2 is a cross-sectional view illustrating a part of a display apparatus according to an embodiment.

FIG. 2 is a cross-sectional view illustrating a part of a display apparatus according to an embodiment.

Referring to FIG. 2, the display apparatus includes the substrate 100, first and second TFTs T1 and T2 located on the substrate 100, and a buffer layer 111, a conductive layer 121, and an insulating layer 123 located between the substrate 100 and the first and second TFTs T1 and T2. In this case, a thickness t2 of the insulating layer 123 may be small enough for the conductive layer 121 to affect semiconductor layers A1 and A2 of the first and second TFTs T1 and T2. For example, the thickness t2 of the insulating layer 123 may be less than a thickness $t_b$ of the buffer layer 111.

The substrate 100 may be formed of any of various materials, such as a glass material, a metal material, or a plastic material. According to an embodiment, the substrate 100 that may be a flexible substrate may include a polymer resin, such as polyether sulfone (PES), polyacrylate (PAR), polyetherimide (PEI), polyethylene naphthalate (PEN), polyethylene terephthalate (PET), polyphenylene sulfide (PPS), polyarylate, polyimide (PI), polycarbonate (PC), or cellulose acetate propionate (CAP).

The buffer layer 111 may be located on the substrate 100, and may reduce or prevent penetration of foreign materials, moisture, or external air from the bottom of the substrate 100 and may planarize a surface of the substrate 100. The buffer layer 111 may include an inorganic material, such as oxide or nitride, an organic material, or a combination of an organic material and an inorganic material, and may have a single or multi-layer structure including an inorganic material and an organic material. In an embodiment, a barrier layer (not shown) for reducing or preventing penetration of external air may be further provided between the substrate 100 and the buffer layer 111. In some embodiments, the buffer layer 111 may include silicon oxide ($SiO_2$) or silicon nitride ($SiN_x$). In some embodiments, the thickness $t_b$ of the buffer layer 111 may be in a range from 1 μm to about 3 μm.

The conductive layer 121 may be located between the buffer layer 111 and the first and second TFTs T1 and T2. The conductive layer 121 may be located under the first and second TFTs T1 and T2 to increase the mobility of the semiconductor layers A1 and A2 of the first and second TFTs T1 and T2. That is, carriers of the conductive layer 121 may be injected into the semiconductor layers A1 and A2 to increase a carrier concentration of the semiconductor layers A1 and A2.

The insulating layer 123 having a small thickness may be located between the conductive layer 121 and the first and second TFTs T1 and T2. The insulating layer 123 may help the semiconductor layers A1 and A2 of the first and second TFTs T1 and T2 to be uniformly formed. Also, the thickness t2 of the insulating layer 123 may be small enough for the carriers of the conductive layer 121 to move through tunneling to the semiconductor layers A1 and A2.

If the semiconductor layers A1 and A2 are directly formed on the conductive layer 121, a problem may be caused during a process. For example, if the semiconductor layers A1 and A2 are directly formed on the conductive layer 121 by using chemical vapor deposition (CVD), an electric field balance may be broken due to the conductive layer 121, thereby leading to an arc. In this case, the semiconductor layers A1 and A2 may not be uniformly formed.

However, since the insulating layer 123 having a small thickness is provided on the conductive layer 121 in the present embodiment, an electric field balance is not broken when the semiconductor layers A1 and A2 are formed, thereby making it possible to uniformly form the semiconductor layers A1 and A2. Also, the thickness t2 of the insulating layer 123 is small enough for the carriers of the conductive layer 121 to move to the semiconductor layers A1 and A2, and, thus, the insulating layer 123 may not affect an increase in mobility due to the conductive layer 121.

In some embodiments, the thickness t2 of the insulating layer 123 may be in a range from about 30 Å to about 50 Å. If the thickness t2 of the insulating layer 123 is less than 30 Å, an electric field imbalance due to the conductive layer 121 may not be prevented. If the thickness t2 of the insulating layer 123 exceeds 50 Å, the carriers of the conductive layer 121 may not move through tunneling to the semiconductor layers A1 and A2.

In some embodiments, the thickness t2 of the insulating layer 123 may be in a range from about 1/600 to about 1/200 of the thickness $t_b$ of the buffer layer 111. The buffer layer 111 may reduce or prevent penetration of external air, may provide a flat top surface, and may have the thickness $t_b$ that is greater than the thickness t2 of the insulating layer 123.

In some embodiments, a thickness t1 of the conductive layer 121 may be in a range from about 30 Å to about 100 Å. If the thickness t1 of the conductive layer 121 is less than 30 Å, the conductive layer 121 may not increase the mobility of the semiconductor layers A1 and A2. If the thickness t1 of the conductive layer 121 exceeds 100 Å, the mobility of the semiconductor layers A1 and A2 may no longer be increased and characteristics of the first and second TFTs T1 and T2 may be degraded.

In some embodiments, when the conductive layer 121 includes a material A, the insulating layer 123 may include an oxide AOx (x is a positive number) of the material A. In this case, the conductive layer 121 and the insulating layer 123 may be formed by using one target in one chamber. That is, after the conductive layer 121 is formed by using a target including the material A, the insulating layer 123 may be formed by using the target by injecting oxygen gas into the same chamber. In some embodiments, the conductive layer 121 and the insulating layer 123 may be deposited by using sputtering.

In some embodiments, the conductive layer 121 may include at least one selected from the group consisting of aluminum (Al), tin oxide (SnO), calcium (Ca), and magnesium (Mg), and the insulating layer 123 may include at least one selected from the group consisting of $Al_2O_3$, $SnO_2$, CaO, and MgO.

The first TFT T1 and/or the second TFT T2 may be located on the insulating layer 123. The first TFT T1 includes the semiconductor layer A1, a gate electrode G1, a source electrode S1, and a drain electrode D1, and the second TFT T2 includes the semiconductor layer A2, a gate electrode G2, a source electrode S2, and a drain electrode D2. The first TFT T1 may be connected to an OLED 300 and may function as a driving TFT for driving the OLED 300. The second TFT T2 may be connected to a data line DL and may function as a switching TFT. Although two TFTs are shown in FIG. 2, the present disclosure is not limited thereto. For example, the number of TFTs may vary from one to seven.

In an embodiment, the semiconductor layers A1 and A2 may include amorphous silicon or polycrystalline silicon. In another embodiment, the semiconductor layers A1 and A2 may include an oxide of at least one material selected from the group consisting of indium (In), gallium (Ga), tin (Sn), zirconium (Zr), vanadium (V), hafnium (Hf), cadmium (Cd), germanium (Ge), chromium (Cr), titanium (Ti), and zinc (Zn). The semiconductor layers A1 and A2 may each include a source region and a drain region doped with impurities and a channel region.

The gate electrodes G1 and G2 are located on the semiconductor layers A1 and A2 with the first gate insulating layer 112 therebetween. The gate electrodes G1 and G2 may have a single or multi-layer structure including molybdenum (Mo), aluminum (Al), copper (Cu), or titanium (Ti). For example, the gate electrodes G1 and G2 may have a single-layer structure formed of Mo.

In an embodiment, the first gate insulating layer 112 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). In some embodiments, a thickness $t_i$ of the first gate insulating layer 112 may be greater than the thickness t2 of the insulating layer 123. For example, the thickness $t_i$ of the first gate insulating layer 112 may be in a range from about 2000 Å to about 3000 Å.

A second gate insulating layer 113 may be provided to cover the gate electrodes G1 and G2. The second gate insulating layer 113 may include $SiO_2$, $SiN_x$, SiON, $Al_2O_3$, $TiO_2$, $Ta_2O_5$, $HfO_2$, or $ZnO_2$. In some embodiments, the second gate insulating layer 113 may have a thickness that is greater than the thickness of the insulating layer 123. For example, the thickness of the second gate insulating layer 113 may be in a range from about 2000 Å to about 3000 Å.

A first electrode CE1 of a storage capacitor Cst may overlap the first TFT T1. For example, the gate electrode G1 of the first TFT T1 may function as the first electrode CE1 of the storage capacitor Cst.

In an embodiment, a second electrode CE2 of the storage capacitor Cst overlaps the first electrode CE1 with the second gate insulating layer 113 therebetween. In this case, the second gate insulating layer 113 may function as a dielectric layer of the storage capacitor Cst. In an embodiment, the second electrode CE2 may include a conductive material including Mo, Al, Cu, or Ti, and may have a single or multi-layer structure including the above material. For example, the second electrode CE2 may have a single-layer structure formed of Mo, or may have a multi-layer structure formed of Mo/Al/Mo.

In an embodiment, an interlayer insulating layer 115 is formed on the entire surface of the substrate 100 to cover the second electrode CE2 of the storage capacitor Cst. The interlayer insulating layer 115 may include $SiO_2$, $SiN_x$, SiON, $Al_2O_3$, $TiO_2$, $Ta_2O_5$, $HfO_2$, or $ZnO_2$.

The source electrodes S1 and S2 and the drain electrodes D1 and D2 are located on the interlayer insulating layer 115. The source electrodes S1 and S2 and the drain electrodes D1 and D2 may include a conductive material including Mo, Al, Cu, or Ti, and may have a single or multi-layer structure including the above material. For example, the source electrodes S1 and S2 and the drain electrodes D1 and D2 may have a multi-layer structure formed of Ti/Al/Ti.

A planarization layer 118 may be located on the source electrodes S1 and S2 and the drain electrodes D1 and D2, and the OLED 300 may be located on the planarization layer 118.

The planarization layer 118 may have a flat top surface such that a pixel electrode 310 may be planarized. The planarization layer 118 may have a single or multi-layer structure including a film formed of an organic material or an inorganic material. The planarization layer 118 may include benzocyclobutene (BCB), PI, hexamethyldisiloxane (HMDSO), a general-purpose polymer, such as polymethyl methacrylate (PMMA) or polystyrene (PS), a polymer derivative having a phenol-based group, an acrylic polymer, an imide-based polymer, an aryl ether-based polymer, an amide-based polymer, a fluorinated polymer, a p-xylene-based polymer, a vinyl alcohol-based polymer, or a blend thereof. In an embodiment, the planarization layer 118 may include $SiO_2$, $SiN_x$, SiON, $Al_2O_3$, $TiO_2$, $Ta_2O_5$, $HfO_2$, or $ZnO_2$. After the planarization layer 118 is formed, chemical mechanical polishing may be performed in order to provide a flat top surface.

In the display area DA of the substrate 100, the OLED 300 is located on the planarization layer 118. The OLED 300 includes the pixel electrode 310, an intermediate layer 320 including an organic emission layer, and a counter electrode 330.

An opening through which any one of the source electrode S1 and the drain electrode D1 of the first TFT T1 is exposed may be formed in the planarization layer 118, and the pixel electrode 310 contacts the source electrode S1 or the drain electrode D1 through the opening and is electrically connected to the first TFT T1.

The pixel electrode 310 may be a light-transmitting electrode or a reflective electrode. In some embodiments, the pixel electrode 310 may include a reflective film formed of silver (Ag), magnesium (Mg), aluminum (Al), platinum (Pt), palladium (Pd), gold (Au), nickel (Ni), neodymium (Nd), iridium (Ir), chromium (Cr), or a compound thereof, and a transparent or semi-transparent electrode layer formed on the reflective film. The transparent or semi-transparent electrode layer may include at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO).

A pixel-defining film 119 may be located on the pixel electrode 310. The pixel-defining film 119 may define a pixel by having an opening 119OP corresponding to each sub-pixel, that is, an opening through which at least a central portion of the pixel electrode 310 is exposed. Also, the pixel-defining film 119 may prevent or substantially prevent an arc between the pixel electrode 310 and the counter electrode 330 by increasing a distance between an edge of the pixel electrode 310 and the counter electrode 330. In an embodiment, the pixel-defining film 119 may be formed of an organic material, such as PI or HMDSO.

In an embodiment, a spacer (not shown) may be located on the pixel-defining film 119. The spacer may prevent or substantially prevent damage to a mask during a mask process needed to form the intermediate layer 320 of the OLED 300. In an embodiment, the spacer may be formed of an organic material, such as PI or HMDSO. In an embodiment, the spacer and the pixel-defining film 119 may be formed at the same time by using a same material. In this case, a halftone mask may be used.

The intermediate layer 320 of the OLED 300 may include the organic emission layer. In an embodiment, the organic emission layer may include an organic material including a fluorescent or phosphorescent material that emits red, green, blue, or white light. The organic emission layer may be formed of a low molecular weight organic material or a high molecular weight material, and functional layers, such as a hole transport layer (HTL), a hole injection layer (HIL), an electron transport layer (ETL), and an electron injection layer (EIL), may be selectively further located under and over the organic emission layer. In an embodiment, the intermediate layer 320 may be located to correspond to each of a plurality of the pixel electrodes 310. However, the present disclosure is not limited thereto, and, for example, the intermediate layer 320 may be located over all the pixel electrodes 310.

The counter electrode 330 may be a light-transmitting electrode or a reflective electrode. In some embodiments, the counter electrode 330 may be a transparent or semi-transparent electrode and may be a metal thin film having a small work function including Li, Ca, LiF/Ca, LiF/Al, Al, Ag, Mg, or a compound thereof. In an embodiment, a transparent conductive oxide (TCO) film, such as ITO, IZO, ZnO, or $In_2O_3$, may be further located on the metal thin film. The counter electrode 330 may be located over the display area DA and the peripheral area PA and may be located on the intermediate layer 320 and the pixel-defining film 119. In an embodiment, the counter electrode 330 may be integrally formed in a plurality of the OLEDs 300 and may correspond to all the pixel electrodes 310.

As described above, since the display apparatus according to an embodiment includes the conductive layer 121 and the insulating layer 123 located between the substrate 100 and the first and second TFTs T1 and T2, the display apparatus including the first and second TFTs T1 and T2 having improved mobility may be realized without defects during a manufacturing process.

Figure 3:
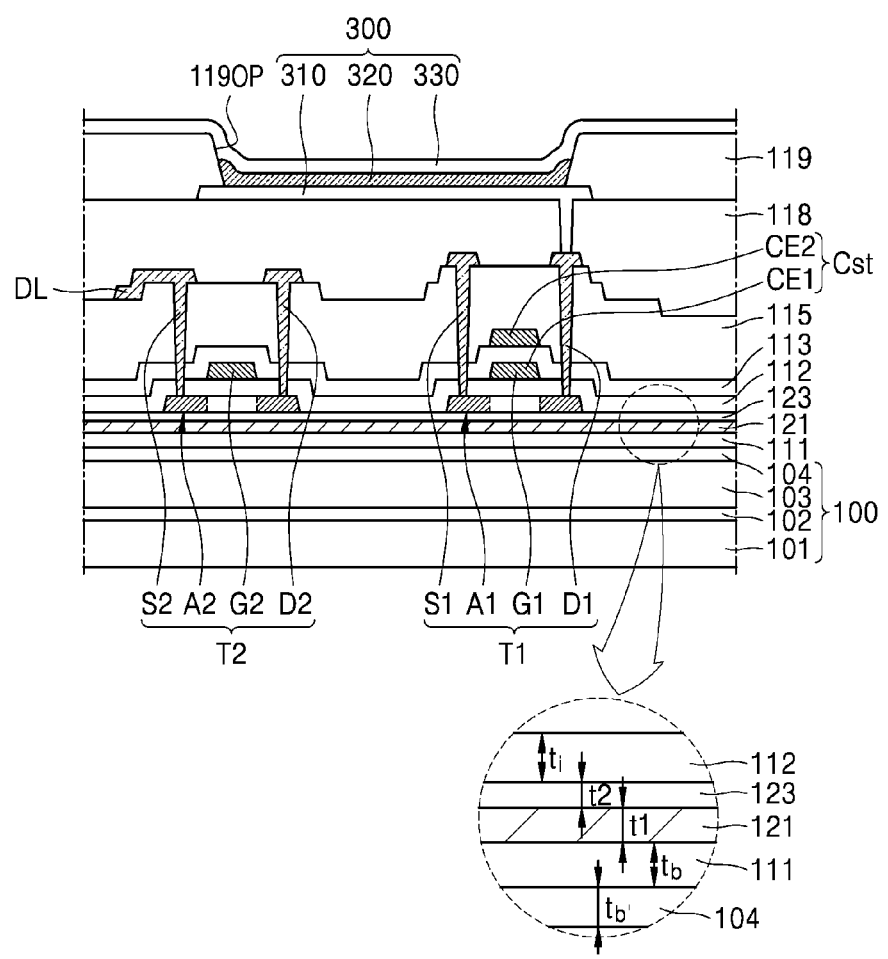
FIG. 3 is a cross-sectional view illustrating a part of a display apparatus according to another embodiment.

FIG. 3 is a cross-sectional view illustrating a part of a display apparatus according to another embodiment. In FIG. 3, the same elements as those in FIG. 2 are denoted by the same reference numerals, and, thus, a repeated explanation thereof will not be given.

Referring to FIG. 3, the display apparatus may include the substrate 100, the first and second TFTs T1 and T2 located on the substrate 100, and the conductive layer 121 and the insulating layer 123 located between the substrate 100 and the first and second TFTs T1 and T2.

In the present embodiment, the substrate 100 may be formed by sequentially stacking a first flexible substrate 101, a first barrier layer 102, a second flexible substrate 103, and a second barrier layer 104. The buffer layer 111 may be located on the second barrier layer 104. In this case, the thickness t2 of the insulating layer 123 may be very small. For example, the thickness t2 of the insulating layer 123 may be less than the thickness $t_b$ of the buffer layer 111 or a thickness $t_b'$, of the second barrier layer 104 (t2<<$t_b$, $t_b'$).

The first flexible substrate 101 and the second flexible substrate 103 include a material having flexibility and electrical insulation. For example, the first flexible substrate 101 and the second flexible substrate 103 may include a polymer resin, such as PES, PAR, PEI, PEN, PET, PPS, PI, PC, or CAP. In an embodiment, the first flexible substrate 101 and the second flexible substrate 103 may be formed of flexible ceramic.

In an embodiment, the first barrier layer 102 and the second barrier layer 104 may include an inorganic material, for example, amorphous silicon, $SiO_2$, or $SiN_x$. The first barrier layer 102 and the second barrier layer 104 may be respectively formed on the first flexible substrate 101 and the second flexible substrate 103 that are vulnerable to air and moisture, may prevent or substantially prevent damage to the first flexible substrate 101 and the second flexible substrate 103, and may reduce or prevent penetration of foreign materials, such as air or moisture, into the display apparatus. The first barrier layer 102 and the second barrier layer 104 may have a thickness in a range from about 2000 Å to several μm. Accordingly, the thickness $t_b'$, of the second barrier layer 104 may be greater than the thickness t2 of the insulating layer 123. In the present embodiment, the buffer layer 111 may be omitted. When the buffer layer 111 is omitted, the second barrier layer 104 may perform the function of the buffer layer 111.

In the present embodiment, the conductive layer 121 and the insulating layer 123 may be located between the second barrier layer 104 and the first and second TFTs T1 and T2. Also, the thicknesses t1 and t2 of the conductive layer 121 and the insulating layer 123 may be much less than the thickness $t_b'$, or $t_b$ of the second barrier layer 104 or the buffer layer 111 (t1, t2<<$t_b'$, $t_b$).

The conductive layer 121 may be located under the first and second TFTs T1 and T2 to increase the mobility of the semiconductor layers A1 and A2 of the first and second TFTs T1 and T2. That is, carriers of the conductive layer 121 may be injected into the semiconductor layers A1 and A2 to increase a carrier concentration of the semiconductor layers A1 and A2.

The insulating layer 123 having a small thickness may be located between the conductive layer 121 and the first and second TFTs T1 and T2. The insulating layer 123 may help the semiconductor layers A1 and A2 of the first and second TFTs T1 and T2 to be uniformly formed. Also, the thickness t2 of the insulating layer 123 may be small enough for the carriers of the conductive layer 121 to move through tunneling to the semiconductor layers A1 and A2.

If the semiconductor layers A1 and A2 are directly formed on the conductive layer 121, a problem may be caused during a process. For example, if the semiconductor layers A1 and A2 are directly formed by using CVD, an electric field balance may be broken due to the conductive layer 121, thereby leading to an arc. In this case, the semiconductor layers A1 and A2 may not be uniformly formed.

However, since the insulating layer 123 having a small thickness is provided on the conductive layer 121 in the present embodiment, an electric field balance is not broken when the semiconductor layers A1 and A2 are formed, thereby making it possible to uniformly form the semiconductor layers A1 and A2. Also, the thickness t2 of the insulating layer 123 is small enough for the carriers of the conductive layer 121 to move to the semiconductor layers A1 and A2, and, thus, the insulating layer 123 may not affect an increase in mobility due to the conductive layer 121.

In some embodiments, the thickness t2 of the insulating layer 123 may be in a range from about 30 Å to about 50 Å. If the thickness t2 of the insulating layer 123 is less than 30 Å, an electric field imbalance due to the conductive layer 121 may not be prevented. If the thickness t2 of the insulating layer 123 exceeds 50 Å, the carriers of the conductive layer 121 may not move through tunneling to the semiconductor layers A1 and A2.

In some embodiments, the thickness t1 of the conductive layer 121 may be in a range from about 30 Å to about 100 Å. If the thickness t1 of the conductive layer 121 is less than 30 Å, the conductive layer 121 may not increase the mobility of the semiconductor layers A1 and A2. If the thickness t1 of the conductive layer 121 exceeds 100 Å, mobility may no longer be increased and characteristics of the first and second TFTs T1 and T2 may be degraded.

In some embodiments, when the conductive layer 121 includes a material A, the insulating layer 123 may include an oxide AOx (x is a positive number) of the material A. In this case, the conductive layer 121 and the insulating layer 123 may be formed by using one target in one chamber. That is, after the conductive layer 121 is formed by using a target including the material A, the insulating layer 123 may be formed by using the target by injecting oxygen gas into the same chamber.

In some embodiments, the conductive layer 121 may include at least one selected from the group consisting of Al, SnO, Ca, and Mg, and the insulating layer 123 may include at least one selected from the group consisting of $Al_2O_3$, $SnO_2$, CaO, and MgO.

The first TFT T1 and/or the second TFT T2 may be located on the insulating layer 123. The first TFT T1 includes the semiconductor layer A1, the gate electrode G1, the source electrode S1, and the drain electrode D1, and the second TFT T2 includes the semiconductor layer A2, the gate electrode G2, the source electrode S2, and the drain electrode D2. The first TFT T1 may be connected to the OLED 300 and may function as a driving TFT for driving the OLED 300. The second TFT T2 may be connected to the data line DL and may function as a switching TFT. Although two TFTs are provided in FIG. 3, the present disclosure is not limited thereto. For example, the number of TFTs may vary from one to seven.

As described above, since the display apparatus according to an embodiment includes the conductive layer 121 and the insulating layer 123 located between the substrate 100 and the first and second TFTs T1 and T2, the display apparatus including the first and second TFTs T1 and T2 having improved mobility may be realized without defects during a manufacturing process.

Figure 4:
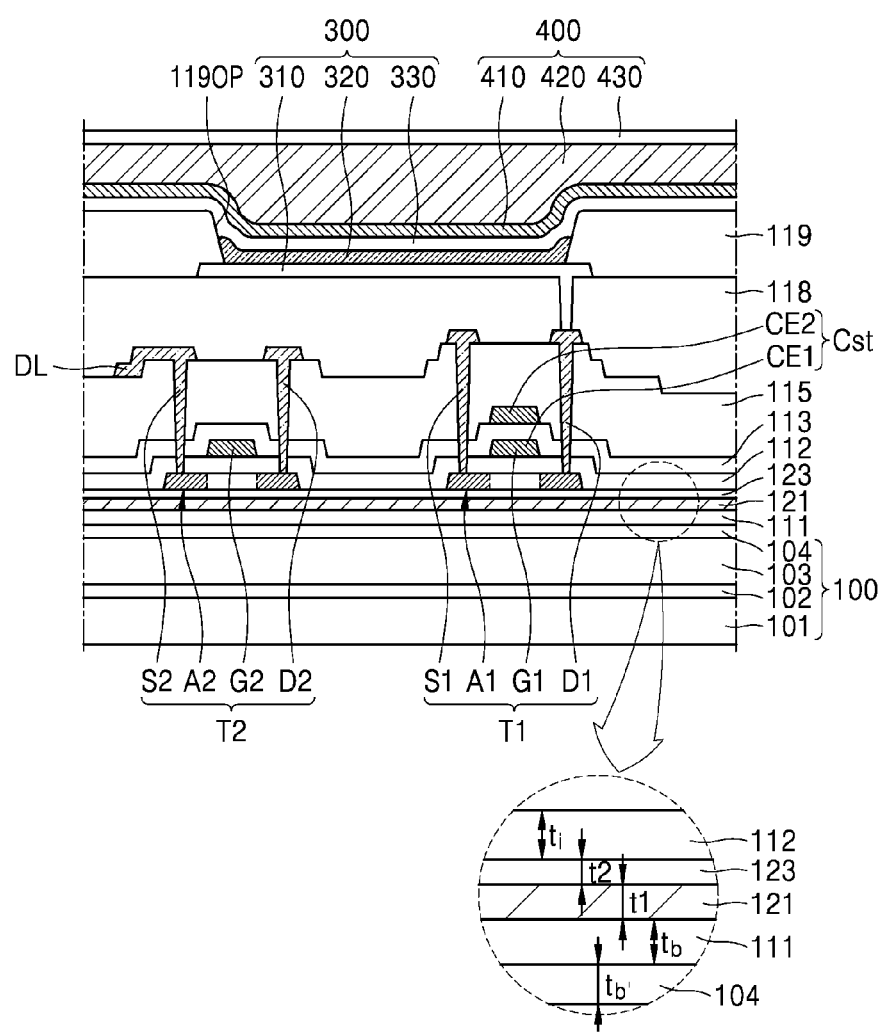
FIG. 4 is a cross-sectional view illustrating a part of a display apparatus according to another embodiment.

FIG. 4 is a cross-sectional view illustrating a part of a display apparatus according to another embodiment. In FIG. 4, the same elements as those in FIG. 3 are denoted by the same reference numerals, and, thus, a repeated explanation thereof will not be given.

Referring to FIG. 4, the display apparatus may include the substrate 100, the first and second TFTs T1 and T2 located on the substrate 100, and the conductive layer 121 and the insulating layer 123 located between the substrate 100 and the first and second TFTs T1 and T2.

In the present embodiment, the substrate 100 may be formed by sequentially stacking the first flexible substrate 101, the first barrier layer 102, the second flexible substrate 103, and the second barrier layer 104. In an embodiment, the buffer layer 111 may be located on the second barrier layer 104. In this case, the thickness t2 of the insulating layer 123 may be very small. For example, the thickness t2 of the insulating layer 123 may be less than the thickness $t_b$ of the buffer layer 111 or the thickness $t_b'$, of the second barrier layer 104 (t2<<$t_b$, $t_b'$).

Also, in the present embodiment, the display apparatus may further include an encapsulation layer 400 for sealing the display area DA. The encapsulation layer 400 may protect the OLED 300 from external moisture or oxygen by covering a display device, etc. located on the display area DA. In an embodiment, the encapsulation layer 400 may include a first inorganic encapsulation layer 410, an organic encapsulation layer 420, and a second inorganic encapsulation layer 430.

In an embodiment, the first inorganic encapsulation layer 410 may cover the counter electrode 330, and may include ceramic, metal oxide, metal nitride, metal carbide, metal oxynitride, $In_2O_3$, $SnO_2$, ITO, silicon oxide, silicon nitride, and/or silicon oxynitride. In an embodiment, other layers such as a capping layer may be located between the first inorganic encapsulation layer 410 and the counter electrode 330. Since the first inorganic encapsulation layer 410 is formed along a lower structure, a top surface of the first inorganic encapsulation layer 410 is not flat, as shown in FIG. 4.

The organic encapsulation layer 420 may cover the first inorganic encapsulation layer 410 to have a flat top surface, unlike the first inorganic encapsulation layer 410. In further detail, the organic encapsulation layer 420 may be formed such that a portion corresponding to the display area DA has a flat top surface. In an embodiment, the organic encapsulation layer 420 may include at least one material selected from the group consisting of acryl, methacryl, polyester, polyethylene, polypropylene, PET, polyethylene naphthalate, polycarbonate, PI, polyethylene sulfonate, polyoxymethylene, polyarylate, and HMDSO.

In an embodiment, the second inorganic encapsulation layer 430 may cover the organic encapsulation layer 420, and may include ceramic, metal oxide, metal nitride, metal carbide, metal oxynitride, $In_2O_3$, $SnO_2$, ITO, silicon oxide, silicon nitride, and/or silicon oxynitride. In an embodiment, the second inorganic encapsulation layer 430 may contact the first inorganic encapsulation layer 410 at an edge outside the display area DA and may prevent the organic encapsulation layer 420 from being exposed to the outside.

In an embodiment, since the encapsulation layer 400 has a multi-layer structure including the first inorganic encapsulation layer 410, the organic encapsulation layer 420, and the second inorganic encapsulation layer 430, even when cracks occur in the encapsulation layer 400, the cracks may not be connected between the first inorganic encapsulation layer 410 and the organic encapsulation layer 420 or between the organic encapsulation layer 420 and the second inorganic encapsulation layer 430. Accordingly, a path through which external moisture or oxygen may penetrate into the display area DA may be prevented or substantially prevented.

In an embodiment, various functional layers, such as a touchscreen layer and a polarization film, may be further located on the encapsulation layer 400, and a capping layer for improving light efficiency may be further located between the counter electrode 330 and the encapsulation layer 400.

Although the display apparatus is sealed by the encapsulation layer 400 in FIG. 4, the present disclosure is not limited thereto. For example, an organic light-emitting display apparatus may be sealed by providing a sealing substrate facing the substrate 100 and attaching the substrate 100 and the sealing substrate on the peripheral area PA by using a sealing material, such as frit.

FIGS. 5A through 5D are cross-sectional views sequentially illustrating a method of manufacturing a display apparatus, according to an embodiment. The display apparatus of FIG. 2 will be described as an example.

Figure 5A:
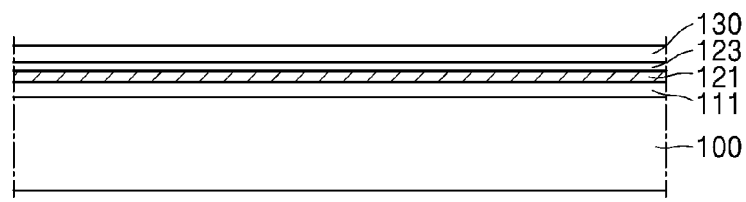
FIGS. 5A through 5D are cross-sectional views sequentially illustrating a method of manufacturing a display apparatus, according to an embodiment.

Referring to FIG. 5A, the buffer layer 111, the conductive layer 121, the insulating layer 123, and a pre-semiconductor layer 130 are sequentially formed on the substrate 100.

In an embodiment, the buffer layer 111 may include $SiO_2$ or $SiN_x$ and may be formed by using a deposition method such as, but not limited to, CVD or sputtering.

The conductive layer 121 may be formed of a conductive material, such as a metal or a conductive polymer. In some embodiments, the conductive layer 121 may be formed of Al, Mg, Ca, or SnO. In an embodiment, the conductive layer 121 may be formed by using sputtering. The conductive layer 121 may be formed to have a thickness in a range from about 30 Å to about 100 Å.

The insulating layer 123 may be formed of an inorganic material and may be thin enough for carriers of the conductive layer 121 to be tunneled. In an embodiment, the insulating layer 123 may be formed by using sputtering. In some embodiments, the insulating layer 123 may be formed of $Al_2O_3$, $SnO_2$, CaO, or MgO. The insulating layer 123 may be formed to have a thickness in a range from about 30 Å to about 50 Å.

In an embodiment, when the conductive layer 121 includes a material A, the insulating layer 123 may include an oxide of the material A. In this case, the conductive layer 121 and the insulating layer 123 may be formed by using one target in one chamber. That is, after the conductive layer 121 is formed by using one target, the insulating layer 123 may be formed by injecting oxygen gas.

The pre-semiconductor layer 130 is formed on the insulating layer 123. The pre-semiconductor layer 130 may be formed of amorphous silicon or an oxide semiconductor. In an embodiment, the pre-semiconductor layer 130 may be deposited by using CVD. If the insulating layer 123 is not provided and the pre-semiconductor layer 130 is directly deposited on the conductive layer 121 by using CVD, an electric field balance may be broken due to the conductive layer 121 and a uniform film may not be formed. However, in the present embodiment, the insulating layer 123 may be provided, an electric field imbalance due to the conductive layer 121 may be prevented, and the pre-semiconductor layer 130 may be uniformly formed.

In an embodiment, the pre-semiconductor layer 130 is an amorphous silicon layer, and the amorphous silicon layer may be formed and then may be crystallized by using any of various methods, such as rapid thermal annealing (RTA), solid-phase crystallization (SPC), excimer laser annealing (ELA), metal-induced crystallization (MIC), metal-induced lateral crystallization (MILC), or sequential lateral solidification (SLS) to produce a polycrystalline silicon layer.

Figure 5B:
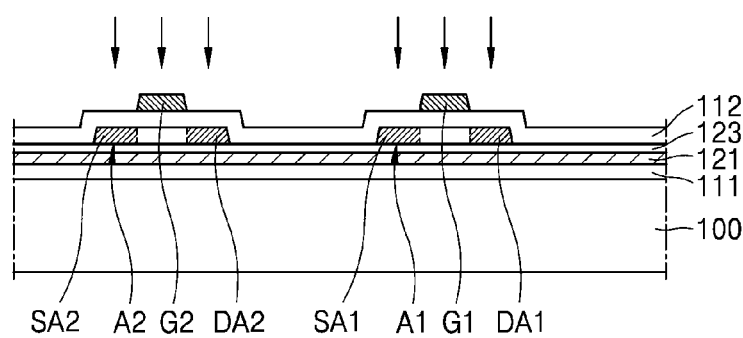

Next, referring to FIG. 5B, in an embodiment, the semiconductor layers A1 and A2 are formed by patterning the pre-semiconductor layer 130, the first gate insulating layer 112 that covers the semiconductor layers A1 and A2 is formed on an entire surface of the substrate 100, and the gate electrodes G1 and G2 are formed on the first gate insulating layer 112.

The first gate insulating layer 112 may include $SiO_2$, $SiN_x$, SiON, $Al_2O_3$, $TiO_2$, $Ta_2O_5$, $HfO_2$, or $ZnO_2$, and may be formed by using a deposition method such as, but not limited to, CVD or sputtering.

The gate electrodes G1 and G2 may have a single or multi-layer structure including Mo, Al, Cu, or Ti. For example, the gate electrodes G1 and G2 may have a single-layer structure formed of Mo. In an embodiment, the gate electrodes G1 and G2 may be formed by forming a metal layer on the entire surface of the substrate 100 and patterning the metal layer. The metal layer may be formed by using a deposition method such as, but not limited to, CVD, plasma-enhanced CVD (PECVD), low-pressure CVD (LPCVD), physical vapor deposition (PVD), sputtering, or atomic layer deposition (ALD).

Next, in an embodiment, the semiconductor layers A1 and A2 are formed of amorphous silicon or polycrystalline silicon, and source regions SA1 and SA2 and drain regions DA1 and DA2 may be formed by implanting n-type or p-type dopants into the semiconductor layers A1 and A2 by using the gate electrodes G1 and G2 as doping masks. When the semiconductor layers A1 and A2 are formed of an oxide semiconductor, a doping process may be omitted.

Figure 5C:
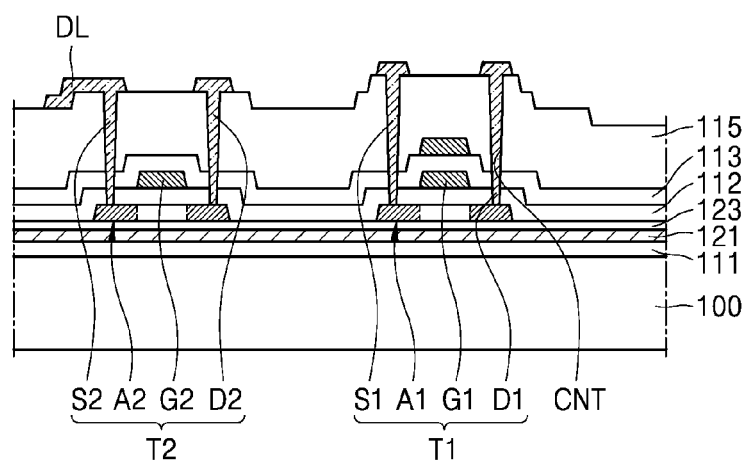

Referring to FIG. 5C, the second gate insulating layer 113 is formed on the entire surface of the substrate 100 to cover the gate electrodes G1 and G2, and the second electrode CE2 of the storage capacitor Cst is formed on the second gate insulating layer 113.

The second gate insulating layer 113 may include $SiO_2$, $SiN_x$, SiON, $Al_2O_3$, $TiO_2$, $Ta_2O_5$, $HfO_2$, or $ZnO_2$, and may be formed by using a deposition method such as, but not limited to, CVD or sputtering.

The second electrode CE2 may be formed on the second gate insulating layer 113 to overlap at least a part of the gate electrode G1 that functions as the first electrode CE1 of the storage capacitor Cst. In an embodiment, the second electrode CE2 may be formed by forming a metal layer having a single or multi-layer structure including Mo, Al, Cu, or Ti and patterning the metal layer.

Next, the interlayer insulating layer 115 is formed on the entire surface of the substrate 100 to cover the second electrode CE2, and contact holes CNT through which the source regions SA1 and SA2 and/or the drain regions DA1 and DA2 of the semiconductor layers A1 and A2 are exposed are formed. Next, the source electrodes S1 and S2 and/or the drain electrodes D1 and D2 may be formed by forming a metal layer filled in the contact holes CNT and patterning the metal layer.

The interlayer insulating layer 115 may include $SiO_2$, $SiN_x$, SiON, $Al_2O_3$, $TiO_2$, $Ta_2O_5$, $HfO_2$, or $ZnO_2$, and may be formed by using a deposition method such as, but not limited to, CVD or sputtering.

The source electrodes S1 and S2 and the drain electrodes D1 and D2 may include a conductive material including Mo, Al, Cu, or Ti, and may have a single or multi-layer structure including the above material. For example, the source electrodes S1 and S2 and the drain electrodes D1 and D2 may have a multi-layer structure formed of Ti/Al/Ti.

Figure 5D:
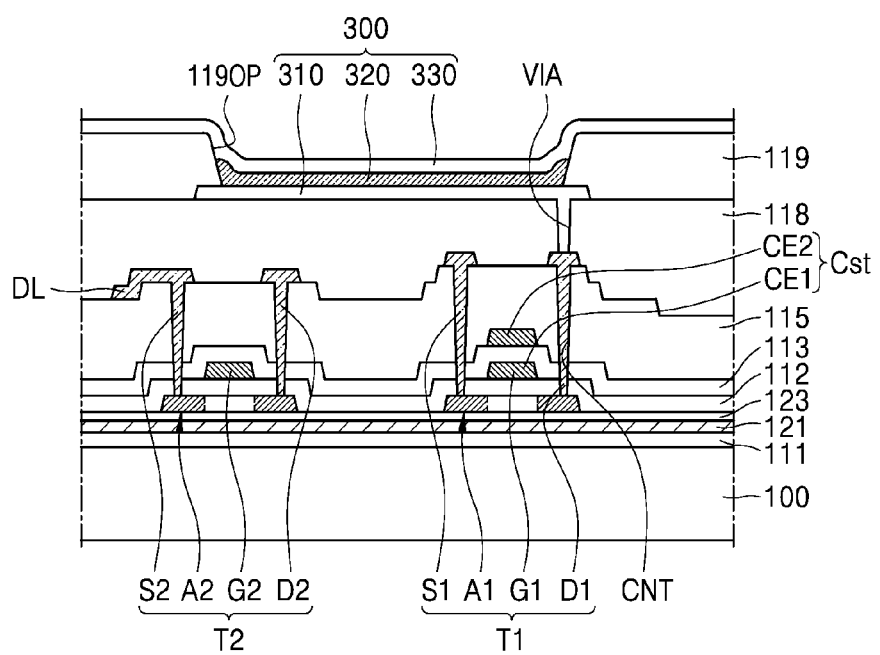

Next, referring to FIG. 5D, the planarization layer 118 having a via hole VIA through which the drain electrode D1 of the first TFT T1 is exposed and the OLED 300 located on the planarization layer 118 are formed.

The planarization layer 118 may have a single or multi-layer structure including a film formed of an organic material or an inorganic material. In an embodiment, the planarization layer 118 may include BCB, PI, HMDSO, a general-purpose polymer such as PMMA or PS, a polymer derivative having a phenol-based group, an acrylic polymer, an imide-based polymer, an aryl ether-based polymer, an amide-based polymer, a fluorinated polymer, a p-xylene-based polymer, a vinyl alcohol-based polymer, or a blend thereof. In an embodiment, the planarization layer 118 may include $SiO_2$, $SiN_x$, SiON, $Al_2O_3$, $TiO_2$, $Ta_2O_5$, $HfO_2$, or $ZnO_2$. After the planarization layer 118 is formed, chemical mechanical polishing may be performed to provide a flat top surface.

Next, the pixel electrode 310 is formed on the planarization layer 118. The pixel electrode 310 may be connected to the first TFT T1 through the via hole VIA formed in the planarization layer 118.

Next, the pixel-defining film 119 having the opening 119OP through which a central portion of the pixel electrode 310 is exposed is formed. In an embodiment, the pixel-defining film 119 may be formed by applying an organic material, such as PI or HMDSO, and developing the organic material. Next, the OLED 300 may be formed by forming the intermediate layer 320 including an organic emission layer and the counter electrode 330 on the pixel electrode 310.

As described above, since the display apparatus according to one or more embodiments includes a conductive layer under a TFT, the mobility of the TFT may be improved. Also, since an insulating layer is located between the conductive layer and the TFT, defects generated during a manufacturing process may be avoided.

However, the scope of the present disclosure is not limited by the aspects and effects described herein.

Although one or more embodiments that may be used as embodiments of the present disclosure have been described herein, the embodiments may be implemented as separate embodiments or combined embodiments. Various combinations are possible. For example, the encapsulation layer 400 described with reference to FIG. 4 may be applied to the embodiment of FIG. 2.

While one or more embodiments have been described with reference to the drawings, it will be understood by one of ordinary skill in the art that various changes in form and details may be made therein without departing from the spirit and scope of the present disclosure as set forth in the following claims.

What is claimed is:

1. A display apparatus comprising:
a substrate;
a thin-film transistor located on the substrate; and
a buffer layer, a conductive layer, and an insulating layer sequentially located from the substrate between the substrate and the thin-film transistor,
wherein the insulating layer is in contact with the thin-film transistor, and a thickness of the insulating layer is from about 30 Å to about 50 Å and is less than a thickness of the buffer layer.

2. The display apparatus of claim 1, wherein the thickness of the insulating layer is from about 1/600 to about 1/200 of the thickness of the buffer layer.

3. The display apparatus of claim 1, wherein the conductive layer comprises a material, and
the insulating layer comprises an oxide AOx of the material, where A is the material and x is a positive number.

4. The display apparatus of claim 3, wherein the material comprises at least one selected from the group consisting of aluminum, tin oxide, calcium, and magnesium, and
the oxide AOx comprises at least one selected from the group consisting of $Al_2O_3$, $SnO_2$, CaO, and MgO.

5. The display apparatus of claim 1, wherein the thin-film transistor comprises:
a semiconductor layer located on the insulating layer and comprising a source region, a drain region, and a channel region;
a gate insulating layer covering the semiconductor layer; and
a gate electrode located on the gate insulating layer to overlap the channel region of the semiconductor layer,
wherein a thickness of the gate insulating layer is greater than the thickness of the insulating layer.

6. The display apparatus of claim 1, further comprising an organic light-emitting device connected to the thin-film transistor and comprising a pixel electrode, an intermediate layer comprising an organic emission layer, and a counter electrode.

7. The display apparatus of claim 1, wherein the substrate comprises a first flexible substrate, a first barrier layer, a second flexible substrate, and a second barrier layer that are sequentially stacked.

8. A display apparatus comprising:
a substrate comprising a first flexible substrate, a first barrier layer, a second flexible substrate, and a second barrier layer that are sequentially stacked;
a thin-film transistor located on the substrate; and
a conductive layer and an insulating layer sequentially located from the second barrier layer between the second barrier layer and the thin-film transistor,
wherein a thickness of the conductive layer is from about 30 Å to about 100 Å, and a thickness of the insulating layer is from about 30 Å to about 50 Å.

9. The display apparatus of claim 8, wherein the conductive layer comprises a material, and
the insulating layer comprises an oxide AOx of the material, where A is the material and x is a positive number.

10. The display apparatus of claim 9, wherein the material comprises at least one selected from the group consisting of aluminum, tin oxide, calcium, and magnesium, and
the oxide AOx comprises at least one selected from the group consisting of $Al_2O_3$, $SnO_2$, CaO, and MgO.

11. The display apparatus of claim 8, further comprising a buffer layer located between the second barrier layer and the conductive layer.

12. The display apparatus of claim 8, wherein the thin-film transistor comprises:
a semiconductor layer located on the insulating layer and comprising a source region, a drain region, and a channel region;
a gate insulating layer covering the semiconductor layer; and
a gate electrode located on the gate insulating layer to overlap the channel region,
wherein a thickness of the gate insulating layer is greater than the thickness of the insulating layer.

13. The display apparatus of claim 12, wherein the thickness of the gate insulating layer is from about 2000 Å to about 3000 Å.

* * * * *